US008805666B2

(12) United States Patent
Tang et al.

(10) Patent No.: US 8,805,666 B2
(45) Date of Patent: Aug. 12, 2014

(54) METHOD FOR CALCULATING PRIMARY TIME CONSTANT OF POWER GRID

(75) Inventors: Baofeng Tang, Hebei (CN); Hui Fan, Hebei (CN)

(73) Assignee: Hebei Electric Power Research Institute (CN)

( * ) Notice: Subject to any disclaimer, the term of this patent is extended or adjusted under 35 U.S.C. 154(b) by 0 days.

(21) Appl. No.: 13/823,624

(22) PCT Filed: Sep. 16, 2011

(86) PCT No.: PCT/CN2011/079708
§ 371 (c)(1),
(2), (4) Date: Mar. 14, 2013

(87) PCT Pub. No.: WO2012/034528
PCT Pub. Date: Mar. 22, 2012

(65) Prior Publication Data
US 2013/0191092 A1    Jul. 25, 2013

(30) Foreign Application Priority Data
Sep. 16, 2010    (CN) .......................... 2010 1 0283753

(51) Int. Cl.
*G06F 17/50*    (2006.01)
*G06G 7/62*    (2006.01)
*G06G 7/54*    (2006.01)
(52) U.S. Cl.
USPC .............................................. 703/18; 703/17
(58) Field of Classification Search
USPC ................................................. 703/14, 17, 18
See application file for complete search history.

(56) References Cited

FOREIGN PATENT DOCUMENTS

CN    101272116 A    9/2008
CN    101957398 A    1/2011

OTHER PUBLICATIONS

Zhongxi et al.; Power System Analysis Software Package (PSASP)—an Integrated Power System Analysis Tool; Proceedings. POWERCON '98; 1998; pp. 7-11.*
Fang et al.; Realization of Electromechanical Transient and Electromagnetic Transient Real Time Hybrid Simulation in Power System; 2005 IEEE/PES Transmission and Distribution Conference & Exhibition: Asia and Pacific Dalian, China.*

(Continued)

*Primary Examiner* — Hugh Jones
(74) *Attorney, Agent, or Firm* — Ohlandt, Greeley, Ruggiero & Perle, LLP

(57) ABSTRACT

A method for calculating a primary time constant of a power grid. It comprises the steps of: establishing an electromechanical transient model of the power grid using the widely used power system analysis software package (PSASP) according to the actual power grid parameters and network topology; establishing an electromagnetic transient model under PASAP using the actual power grid parameters for a site which requires the calculation of the primary time constant of the power grid, and setting a ground short circuit fault at the site; obtaining a transient short circuit current of the short circuit point of the power grid using a hybrid simulation method of the electromechanical and electromagnetic transient models; filtering out a periodic component in the transient short circuit current to obtain a non-periodic component attenuated with time, and finding the attenuation time constant of the non-periodic component which is the primary time constant of the power grid.

2 Claims, 5 Drawing Sheets

(56) References Cited

OTHER PUBLICATIONS

Bao-Feng Tang, Hui Fan, et al. (inventors et al.: The Debugging Technique of Relay Protection of Digital Substation. CICED 2008: Protection, control, communication and automation of distribution network; S3-12; Technical Session 3; CP1566. pp. 1-4.*
Yongli et al.: A Fast Algorithm to Remove Decaying DC and Harmonics for Protective Relaying; TENCON 2004. 2004 IEEE Region 10 Conference (vol. C ); pp. 283-286; 2004.*
Yalou et al.; Parallel Algorithms for Transient Stability Simulation on PC Cluster, 2002. Proceedings. PowerCon 2002. International Conference on Power System Technology; pp. 1592-1596.*
Chao et al.; Dynamic Modeling and Transient simulation for VSC based HVDC in Multi-Machine System; 2006 International Conference on Power System Technology; pp. 1-7.*
Wenhui et al., An Improved Full-Wave Fourier Algorithm for Filtrating Decaying Dc Component; Automation of Electric Power System; one page; 2002.*
Kai et al.; A Compact Algorithm for Filtering Decaying DC Component in Relay Protection Fourier Algorithm; Automation of Electric Power Systems; 2003; one page.*
Baofeng et al.; Automation of Electric Power Systems; one page; 2012.*
Zhou et al., "Analog Simulator Tests Qualify Distance Relay Designs to Today's Stringent Protection Requirements," presented at the 32nd Annual Western Protective Relay Conference, Spokane, WA, Oct. 2005; pp. 1-8.*
Wang et al.: Development of Auxiliary Line Loss Management System in Hebei Grid; UPEC2010 Aug. 31-Sep. 3, 2010; four pages.*
Lu et al.; Morphological transform for removal of exponentially decaying DC-offset; Electronics Letters Apr. 24, 2008 vol. 44 No. 9. pp. 1-2.*
Shen et al.; Power system protection product dynamic simulation, Appendix B, Corresponding to the old standard: SD 286-88; (in Chinese) 2005; 15 pages.*
International Search Report dated Dec. 15, 2011 from PCT/CN2011/079708; 6 pages.
Xu, Ying, Analysis of Shanxi Power Grid Transient Stability Based on PSASP, Thesis of Masters Degree, Taiyuan University of Technology, online publishing, Feb. 25, 2008, pp. 44-49—(English Translation of Abstract).
Power System Analysis Software Package V7.0; Load flow calculation user's Manual with English Abstract; prior to 2009; 68 pages.
GB 1208-1997; Current Transformer's (with translation of relevant portion of section 6.3.3); 1997, 31 pages, Table 11 only is translated.
Xu Ying, "Analysis of Shanxi Power Grid Transient Stability Based on PSASP", Taiyuan University of Technology, Taiyuan, Shanxi, China, May 2007, 82 pp.

* cited by examiner

METHOD FOR CALCULATING PRIMARY TIME CONSTANT OF POWER GRID

CROSS REFERENCE TO RELATED APPLICATION

The application claims the priority of Chinese Patent Application No. 201010283753.X, titled "METHOD FOR DETECTING AND CALCULATING PRIMARY TIME CONSTANT OF POWER GRID BASED ON TECHNOLOGY OF ELECTROMECHANICAL TRANSIENT AND ELECTROMAGNETIC TRANSIENT HYBRID SIMULATION" and filed with the State Intellectual Property Office on Sep. 16, 2010, which is incorporated by reference in its entirety herein.

FIELD OF THE INVENTION

The invention relates to the field of detection and calculation technology of electromagnetic transient hybrid simulation, and in particular to a method for calculating a primary time constant of a power grid.

BACKGROUND OF THE INVENTION

Among the detection performed by an existing current transformer in China, according to a national standard GB/T 1208-1997 "CURRENT TRANSFORMER", only a steady-state error of the current transformer is detected, so as to draw a curve of error of 5% or 10%. An accurate limit of the current transformer should satisfy the following standard:

| accuracy class | current error under rated primary current (%) | phase displacement under rated primary current | | multiple-error under primary current with rated accurate limit (%) |
|---|---|---|---|---|
| | | ±' (minute) | ±crad | |
| 5P | ±1 | 60 | 1.8 | 5 |
| 10P | ±3 | — | — | 10 |

With the development of national economy and the investment to the power system by the country, the power system with a high voltage and a large power grid is developed, and the short circuit capacity of the power grid increases quickly. Consequently, at the beginning of a system fault, the influence of the transient characteristic of a current transformer to the relay protection device can not be ignored. Presently, a state grid company establishes related industrial standards actively, and requires local grid companies to test the transient characteristic of the current transformer.

A primary time constant of a power grid directly influences the analyzing result of the transient characteristic of the current transformer. The primary time constants $T_p$ in the systems which are located at different sites are different greatly. The $T_p$ of a power transmission line is 20 ms to 30 ms, and the $T_p$ of a large generator-transformer is larger than 200 ms. Consequently, the accurate calculation of the primary time constant of the power grid at current transformer installation sites is an important premise and base of detecting the transient characteristic of the current transformer.

The influence of $T_p$ to a protective current transformer mainly includes the following.

A transient area coefficient Ktd of the current transformer is an important parameter for reflecting an anti-saturation ability of the current transformer. For a single power cycle C-t-O:

$$Ktd = \frac{\omega T_p T_s}{T_p - T_s}\left(e^{-\frac{t}{T_p}} - e^{-\frac{t}{T_s}}\right) + 1,$$

in which $T_s$ is a secondary time constant of the current transformer.

For two power cycles C-t'-O-$t_{fr}$-C-t"-O:

$$K_{td} = \left[\frac{\omega T_p T_s}{T_p - T_s}\left(e^{-\frac{t'}{T_p}} - e^{-\frac{t'}{T_s}}\right) - \sin\omega t'\right] \times e^{-\frac{(t_{fr}+t'')}{T_s}} + \frac{\omega T_p T_s}{T_p - T_s}\left(e^{-\frac{t''}{T_p}} - e^{-\frac{t''}{T_s}}\right) + 1,$$

in which t' is a time of a first power cycle, t" is a time of a second power cycle, and $t_{fr}$ is a time of no current between two power cycles.

There are different values of the transient area coefficient $K_{td}$ of the current transformer calculated from different $T_p$, the difference of which is large.

Taking a measured current transformer of lgso20 type as example:
 if $T_p$=100 ms, $K_{td}$=10.1;
 if $T_p$=60 ms, $K_{td}$=8.18; and
 if $T_p$=20 ms, $K_{td}$=4.71.

It can be seen that the accurate calculation of the primary time constant $T_p$ is an import premise of analyzing the transient characteristic of the current transformer.

In addition, the primary time constant $T_p$ of the power grid determines an attenuation speed of a non-periodic component of the short circuit current. When a fault takes place outside of a line differential protection area, the current transformers at the two sides can detect the difference between the transient attenuation current. When the difference between the transient attenuation current exceeds a preset value of differential protection, a misoperation of differential protection will be caused.

SUMMARY OF THE INVENTION

An object of the invention is to provide a method for calculating a primary time constant of a power grid, for accurately grasping a transient characteristic of the current transformer, so that a misoperation of a protection device can be avoided by reasonably adjusting a preset value of a relay protection.

The technical solution adopted to solve the technical problem of the invention is as follows.

A method for calculating a primary time constant of a power grid includes:
 establishing, according to actual power grid parameters and a network topology, an electromechanical transient model of the power grid by using a Power System Analysis Software Package (PSASP);
 establishing an electromagnetic transient model of a local power grid for a site where the primary time constant of the power grid is calculated, by using the PSASP according to the actual power grid parameters, and setting a ground short circuit fault at the site; and
 calculating automatically a transient short circuit current of the site by using a hybrid simulation of the electromechanical transient model and the electromagnetic transient model of the PSASP; and filtering out a periodic component in the transient short circuit current to obtain a non-periodic component attenuated with time, calculating an attenuation time constant of the non-periodic component, the attenuation time constant being the primary time constant of the power grid.

2. The method for calculating the primary time constant of the power grid according to claim 1, wherein the filtering out a periodic component in the transient short circuit current to obtain a non-periodic component attenuated with time, calculating an attenuation time constant of the non-periodic component, the attenuation time constant being the primary time constant of the power grid, includes:

setting an expression of the transient short circuit current with the periodic component and the non-periodic component as:

$$I(t) = A*\sin(\omega t + \pi) + B*e^{-\frac{t}{T_p}},$$

wherein $A*\sin(\omega t + \pi)$ is the periodic component, $$B*e^{-\frac{t}{T_p}},$$

is the non-periodic component, $T_p$ is the primary time constant of the power grid to be solved, A and B respectively represent amplitudes of the periodic component and the non-periodic component;

the periodic component of the transient short circuit current is filtered out by a half period delay superposition method which includes:

setting the transient short circuit current $I_1(t)$ sampled at a sampling point of time t;
setting the transient short circuit current $I_2(t+T/2)$ sampled at a sampling point of time $t+T/2$;
wherein T is a period of the periodic component, and T=20 ms;
superposing the sampled values at the time t and the time $t+T/2$ to obtain a filtered sampled value $I(t)=I_1(t)+I_2(t+T/2)$ at the time t during T/2, in the case that the change of the non-periodic component is ignored;
calculating the non-periodic component of the transient short circuit current of the power grid from $I(t)=I_1(t)+I_2(t+T/2)$, the non-periodic component of the transient short circuit current of the power grid being equal to:

$$I(t) = \frac{1}{2}[I_1(t) + I_2(t)] = B*e^{-\frac{t}{T_p}},$$

calculating a natural logarithm operation on both sides of the above equation, obtaining that:

$$\ln(I(t)) = \ln B - \frac{t}{T_p};$$

wherein $\ln(I(t))$ has a linear relationship with t, and a slope of the linear relationship is $$-\frac{1}{T_p};$$

calculating the slope $$-\frac{1}{T_p}$$

to obtain the primary time constant of the power grid $T_p$.

The beneficial effect of the invention is as follows.

The primary time constant of the power grid determines an attenuation speed of the non-periodic component of the short circuit current of the power grid. As the main protection of various electric elements (a generator, a transformer, a power transmission line, an electric motor etc.), the differential protection has been widely applied in the power systems of various voltage levels. If a system short circuit fault takes place outside of the protection area, and the difference between the primary time constants at the current transformer installation sites which is located at the two sides of the differential protection is large, the transient characteristics of the current transformers at the two sides will present different features. In this case, the current transformer with a larger primary time constant will enter the protection state firstly, and thus a differential current is generated in the differential protection. A large differential current will cause the misoperation of the protection device, thus resulting in the expansion of the system fault. An accurate calculation of the primary time constant of the system can accurately determinate the transient characteristic of the current transformer, and the misoperation of the protection device can be avoided by reasonably adjusting the preset value of the relay protection. The primary time constant of the power grid is a very important parameter. According to the actual requirement of the application analysis of power system projects, the invention provides a method for calculating the primary time constant of the power grid, so as to improve the analysis and control ability of engineers on the power system. Therefore, the method has a great technology and a high practicability.

DETAILED DESCRIPTION OF THE INVENTION

Figure 1:
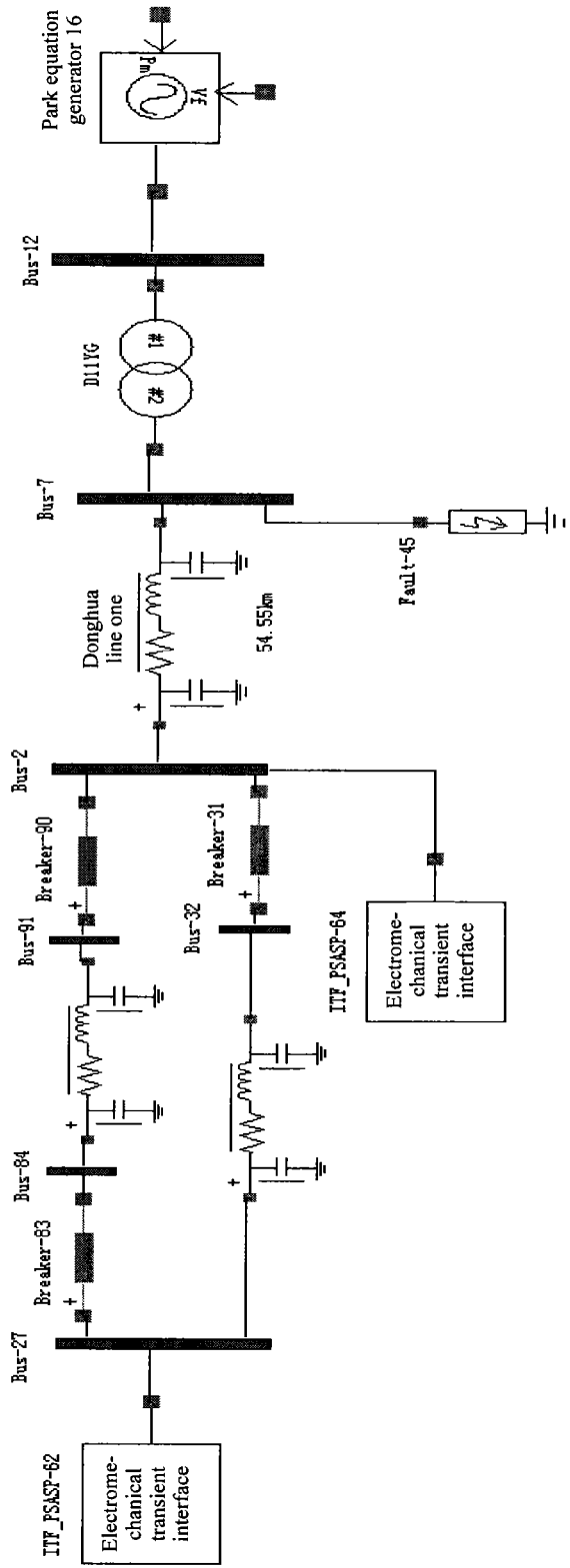
FIG. 1 is a diagram showing an electromagnetic simulation model established by using a PSASP simulation tool according to an embodiment.

In order to make the above-described objects, features and advantages of the invention more obvious and easy to be understood, the specific embodiments of the invention are illustrated in detail in conjunction with the drawings hereinafter.

In order to make the objects, technical solutions and advantages of the invention more clear, the invention is further illustrated in detail in conjunction with the embodiments and the drawings hereinafter. Herein, the exemplary embodiments and its illustration are used to explain the invention, and should not be understood as limiting the invention.

A method for calculating a primary time constant of a power grid according to the invention includes the following steps:

(1) establishing, according to actual power grid parameters and a network topology, an electromechanical transient model of the power grid by using a Power System Analysis Software Package (PASAP).

It should be noted that the actual power grid parameters herein include parameters for all the electric elements of the power system, such as a generator, a transformer, a power transmission line, a bus, a load.

(2) establishing an electromagnetic transient model of a local power grid for a site where the primary time constant of the power grid is calculated, by using the PSASP according to the actual power grid parameters, and setting a ground short circuit fault at the site, in which the fault time is set as the time when a transient voltage of a single-phase bus is close to zero.

When the transient voltage of the single-phase bus is close to zero, the short circuit current has a fully offset characteristic, which can obtain a maximum non-periodic component and is beneficial to improve the accuracy of the calculation.

It should be noted that the maximum non-periodic component can be obtained by setting the ground short circuit fault. The specific steps of setting the ground short circuit fault includes: providing a fault element at the site and setting a ground short circuit fault. The ground fault may be a single-phase ground fault or a three-phase ground fault.

The electromagnetic transient model of the local power grid can be a generator model, a transformer model, a line model, or any combination thereof.

Since local power grid companies periodically make a power grid planning and a operation mode calculation, the electromechanical transient model of PSASP can be directly obtained from a local dispatching department. It only needs to perform a modeling for the electromagnetic transient model of the local power grid. Consequently, the modeling of the electromagnetic transient model is very convenient, so as to reduce a working strength, improve a working efficiency, and make the process of acquiring the primary time constant of the power grid faster.

(3) calculating automatically the transient short circuit current of the site by using a hybrid simulating function of the electromechanical transient model and the electromagnetic transient model of the PSASP.

The simulation of the electromechanical transient model is essentially different from the simulation of the electromagnetic transient model.

The simulation modeling of the electromagnetic transient model is punctilious, which considers features such as non-linearity and distributing parameters. The simulation modeling of the electromagnetic transient model is based on the way of three-phase instantaneous value, and the step length is in microseconds. The simulation modeling of the electromechanical model is simple, which adopts lumped parameters. The system of the simulation modeling of the electromechanical model is characterized by a fundamental wave vector mode, and the step length is in milliseconds.

The simulation of the electromechanical transient model can not simulate a local fast changing process of the system accurately and in detail, and the simulation of the electromagnetic transient model can not simulate the whole system due to limitations of the speed and the scale. Therefore, the hybrid simulation of the electromechanical transient model and the electromagnetic transient model of the power system can achieve an analysis and calculation on the power system based on a large power grid, so as to avoid the calculation error caused by a system equivalence and improve the accuracy of simulation calculation greatly.

(4) filtering out a periodic component in the transient short circuit current to obtain a non-periodic component which is attenuated with time, calculating an attenuation time constant of the non-periodic component, the attenuation time constant being the primary time constant of the power grid.

The primary time constant of the power grid determines the attenuation speed of the non-periodic component of the short circuit current of the power grid. As a main protection of various electric elements (a generator, a transformer, a power transmission line, an electric motor etc.), the differential protection has been widely applied in the power systems of various voltage levels. If a system short circuit fault occurs outside of the protection area, and the difference between the primary time constants at the current transformer installation sites which is located at the two sides of the differential protection is large, the transient characteristics of the current transformers at the two sides will present different features. In this case, the current transformer with a larger primary time constant will enter the protection state firstly, and thus a differential current is generated in the differential protection. A large differential current will cause the misoperation of the protection device, thus resulting in the expansion of the system fault. An accurate calculation of the primary time constant of the system can accurately determinate the transient characteristic of the current transformer, and the misoperation of the protection device can be avoided by reasonably adjusting the preset value of the relay protection. The primary time constant of the power grid is a very important parameter. According to the actual requirement of application analysis of power system projects, the invention provides a method for calculating the primary time constant of the power grid, so as to improve the analysis and control ability of engineers on the power system. Therefore, the method has a great technology and a high practicability.

The steps for calculating the primary time constant of the power grid according to the invention will be described hereinafter.

The transient short circuit current includes a periodic component and a non-periodic component, the expression of the transient short circuit current is:

$$I(t) = A * \sin(\omega t + \pi) + B * e^{-\frac{t}{T_p}}$$

where $A*\sin(\omega t+\pi)$ is the periodic component, $$B * e^{-\frac{t}{T_p}}$$

is the non-periodic component, $T_p$ is the primary time constant of the power grid to be solved, A and B respectively represent amplitudes of the periodic component and the non-periodic component.

Firstly, the periodic component of the transient short circuit current is filtered out by adopting a half period delay superposition method which includes:

setting the transient short circuit current $I_1(t)$ sampled at a sampling point of time t;

setting the transient short circuit current $I_2(t+T/2)$ sampled at a sampling point of time $t+T/2$;

where T is a period of the periodic component, and T=20 ms.

During T/2, in the case that the change of the non-periodic component is ignored, the sampled values at the time t and at the time t+T/2 are superposed to obtain a filtered sampled value at the time t, i.e. $I(t)=I_1(t)+I_2(t+T/2)$;

After the sampled transient short circuit currents are superposed, the wave crest and the wave trough offset, and thus the periodic component is filtered out. Since the change of the non-periodic component can be ignored during a half period, the half of the superposed value of the two sampled values is the non-periodic component.

The non-periodic component of the transient short circuit current of the power grid is calculated from $I(t)=I_1(t)+I_2(t+T/2)$, and the non-periodic component of the transient short circuit current of the power grid is equal to:

$$I(t) = \frac{1}{2}[I_1(t) + I_2(t)] = B * e^{-\frac{t}{T_p}},$$

a natural logarithm operation is calculated on both sides of the above equation, obtaining that:

$$\ln(I(t)) = \ln B - \frac{t}{T_p};$$

where $\ln(I(t))$ has a linear relationship with t, and a slope of the linear relationship is $$-\frac{1}{T_p}.$$

The primary time constant of the power grid $T_p$ is obtained by calculating the slope $$-\frac{1}{T_p}.$$

FIG. 1 is a diagram showing an electromagnetic simulation model established by using the PSASP simulation tool according to an embodiment. The electromagnetic model includes a generator, a transformer, a power transmission line, a bus and a breaker. The electromagnetic model performs a data interaction with the electromechanical simulation model via two electromechanical transient interfaces ISF_PSASP-62 and ISF_PSASP-64. A phase-A ground short circuit fault is set on a bus Bus-7 at the high voltage side of the transformer.

Figure 2:
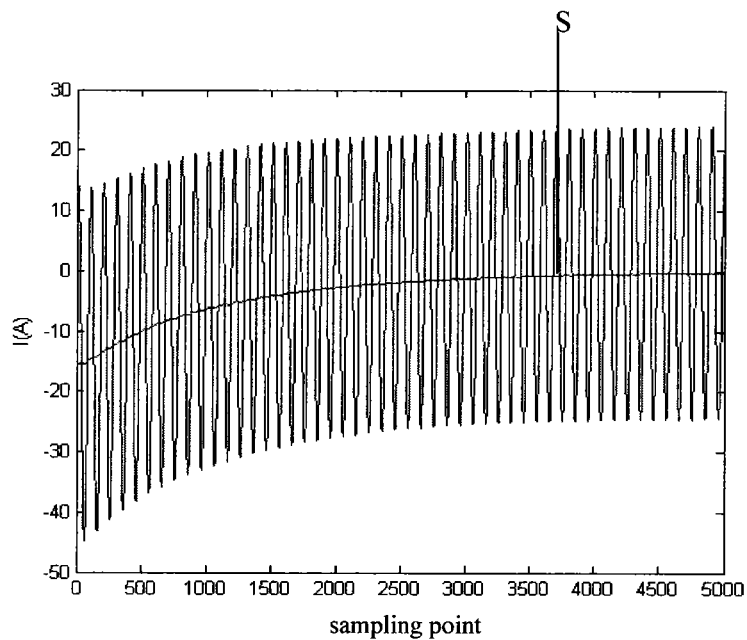
FIG. 2 is a diagram showing a waveform of a system short circuit fault current at the #2 side of a D11YG transformer model.

FIG. 2 is a diagram showing a waveform of a phase-A short circuit current at the high voltage side of the transformer in FIG. 1. The periodic component is filtered out by means of a half period delay superposition algorithm, so as to obtain the non-periodic component indicated by a curve S in FIG. 2.

Figure 3:
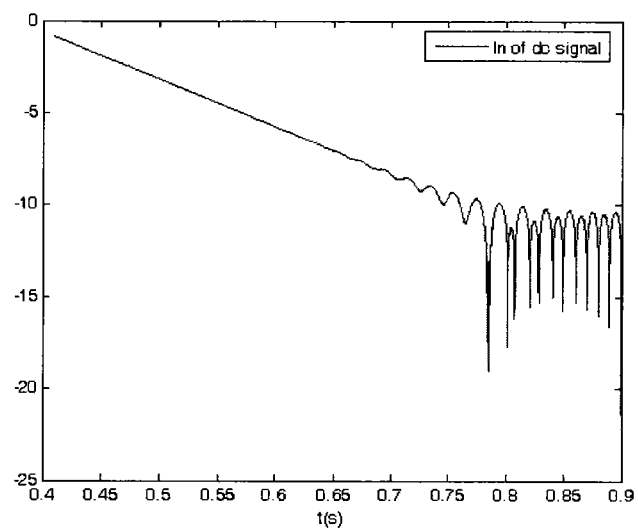
FIG. 3 is a diagram showing a waveform of a non-periodic component of the above-described short circuit current after a natural logarithm operation is calculated.

FIG. 3 is a diagram showing a waveform of the non-periodic component of the phase-A short circuit current at the high voltage side of the transformer in FIG. 1 after a natural logarithm operation is calculated. Particularly, the line part is a valid value, the slope of the line is $$-\frac{1}{T_p},$$

such that the accurate primary time constant of the power grid $T_p$ is obtained.

Figure 4:
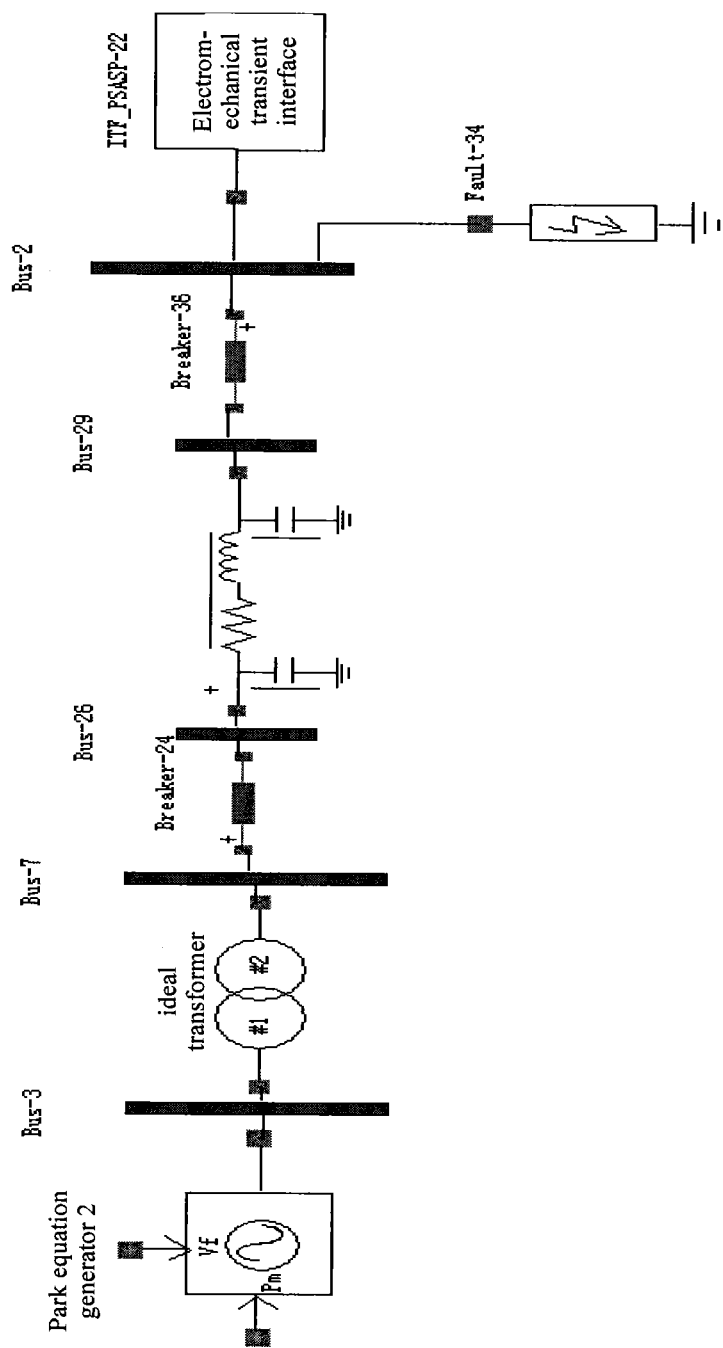
FIG. 4 is a diagram showing an electromagnetic simulation model established by using the PSASP simulation tool according to another embodiment.

FIG. 4 is a diagram showing an electromagnetic simulation model established by using the PSASP simulating tool according to another embodiment. The electromagnetic model includes a generator, a transformer, a power transmission line, a bus and a breaker. The electromagnetic model performs a data interaction with the electromechanical simulation model via the interface element ISF_PSASP-22. The phase-A ground short circuit fault is set on a bus Bus-2.

Figure 5:
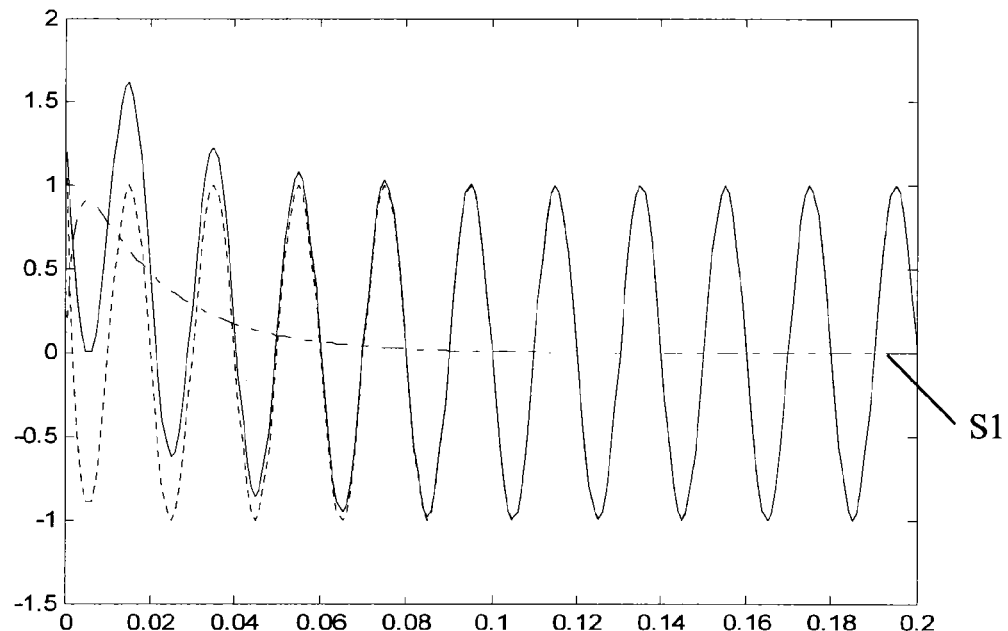
FIG. 5 is a diagram showing short circuit currents acquired at both sides of a differential protection of a power transmission line.

FIG. 5 is diagram showing a phase-A short circuit current detected by breakers Breaker-24 and Breaker-36 at both sides of the power transmission line. The initial currents at the two sides are the same, but the primary time constants of the power grid at the two sides are different. The primary time constant at the Breaker-24 side is 212 ms, while the primary time constant at the Breaker-36 side is 39.1 ms. The non-periodic component of the current at the Breaker-36 side is attenuated quickly, which will be attenuated to zero after one period. Since the primary time constant of the power grid at the Breaker-24 side is large, the non-periodic component is slowly attenuated to zero after 5 periods. The differential current generated during the differential protection is shown as a curve S1 in the figure. A large differential current generates in the relay protection device in the initial several periods. When the differential current is larger than a preset value of the relay protection, the misoperation of the relay protection device is performed.

Figure 6:
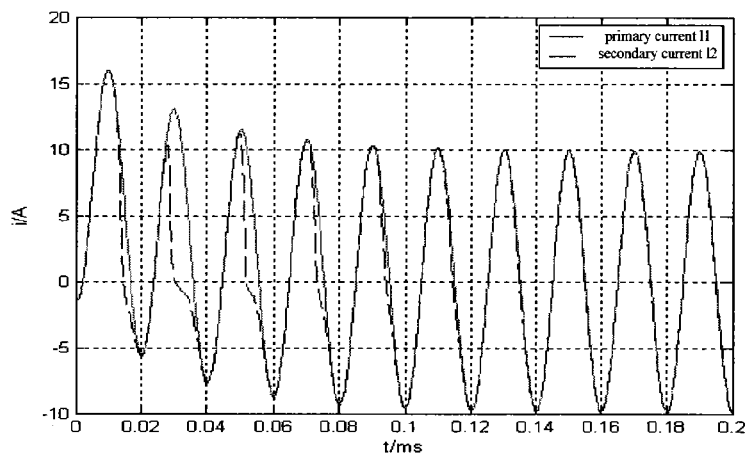
FIG. 6(a) is a diagram showing a saturation characteristic curve of a current transformer when $T_p$=32.8 ms.
FIG. 6(b) is a diagram showing a saturation characteristic curve of a current transformer when $T_p$=200 ms.
Figure 6:
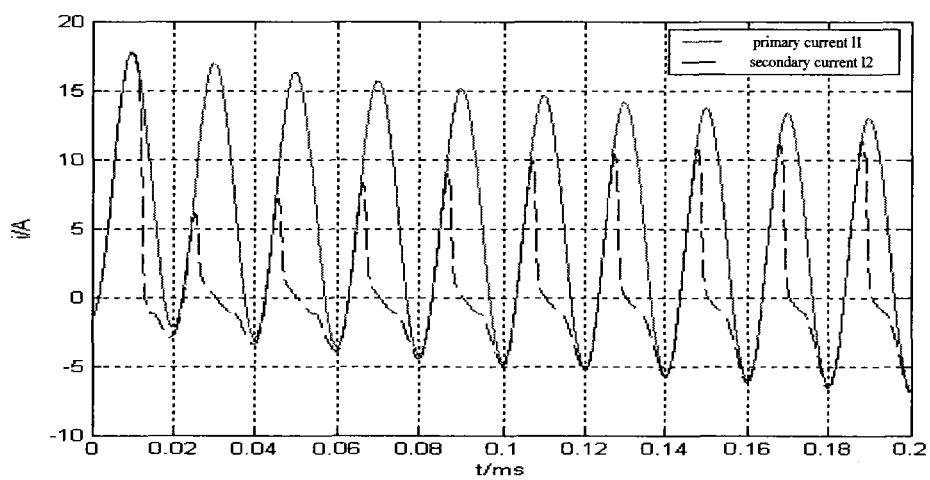

FIG. 6 are diagrams showing a saturation characteristic curve of a current transformer due to the different primary time constant of the power grid in the cases of the same short circuit current. In FIG. 6(a), $T_p$=32.8 ms; and in FIG. 6(b), $T_p$=200 ms. As can be seen from the comparison of the two Figures, in FIG. 6(a), the value of $T_p$ is small, the current transformer is saturated slightly, and the saturation phenomenon of the current transformer disappears within 5 periods after the fault occurs. In FIG. 6(b), the value of $T_p$ is large, so that a deep saturation takes place in the current transformer in the first period immediately after the fault occurs. The saturation phenomenon still exists in the current transformer in the tenth period. At this time, the detected system short circuit current is smaller than the actual short circuit current of the system, which will result in a refuse operation of the relay protection device.

In summary, the primary time constant of the power grid is very important to the current transformer. The method for calculating the primary time constant of the power grid provided by the invention can accurately calculate $T_p$, so as to improve the analysis and control ability on the power system. Therefore, the method has a great technology and a high practicability.

The above-described are only the preferred embodiments of the invention, and should not be interpreted as limiting the invention in any form. Although preferred embodiments of the present invention are disclosed above, it should not be interpreted as limiting the invention. Numerous variations, modifications and equivalents can be made to the technical solution of the invention by those skilled in the art by using the methods and technical content disclosed herein without deviation from the scope of the present invention. Therefore, any variations, modifications and equivalents made to the embodiments above according to the technical essential of the invention without deviation from the scope of the invention should fall within the scope of protection of the invention.

The invention claimed is:

1. A method for calculating a primary time constant of a power grid, comprising:
   establishing, according to actual power grid parameters and a network topology, an electromechanical transient model of the power grid by using a Power System Analysis Software Package (PSASP);
   establishing an electromagnetic transient model of a local power grid for a site where the primary time constant of the power grid is calculated, by using the PSASP according to the actual power grid parameters, and setting a ground short circuit fault at the site;

calculating automatically a transient short circuit current of the site by using a hybrid simulation of the electromechanical transient model and the electromagnetic transient model of the PSASP; and filtering out a periodic component in the transient short circuit current to obtain a non-periodic component attenuated with time, calculating an attenuation time constant of the non-periodic component, the attenuation time constant being the primary time constant of the power grid, wherein the periodic component in the transient short circuit current is filtered out by:

sampling a first transient short circuit current at a sampling point of time t;

sampling a second transient short circuit current at a sampling point of time t+T/2, wherein T is a period of the periodic component;

superposing the first transient short circuit current and the second transient short circuit current to obtain the non-periodic component attenuated with time.

2. The method for calculating the primary time constant of the power grid according to claim 1, wherein the filtering out a periodic component in the transient short circuit current to obtain a non-periodic component attenuated with time, calculating an attenuation time constant of the non-periodic component, the attenuation time constant being the primary time constant of the power grid comprises:

setting an expression of the transient short circuit current with the periodic component and the non-periodic component as:

$$I(t) = -A * \sin\omega t + B * e^{-\frac{t}{T_p}},$$

wherein $A*\sin \omega t$ is the periodic component, $$B * e^{-\frac{t}{T_p}}$$

is the non-periodic component, $T_p$ is the primary time constant of the power grid to be solved, A and B respectively represent the amplitudes of the periodic component and the non-periodic component;

filtering out the periodic component in the transient short circuit current by adopting a half period delay superposition method which comprises:

setting the transient short circuit current $I_1(t)$ sampled at a sampling point of time t;

setting the transient short circuit current $I_2(t+T/2)$ sampled at a sampling point of time t+T/2;

wherein T is a period of the periodic component, and T=20 ms;

superposing the sampled values at the time t and the time t+T/2 to obtain a filtered sampled value $I(t)=I_1(t)+I_2(t+T/2)$ at the time t during T/2, in the case that the change of the non-periodic component is ignored;

calculating the non-periodic component of the transient short circuit current of the power grid from $I(t)=I_1(t)+I_2(t+T/2)$, the non-periodic component of the transient short circuit current of the power grid being equal to:

$$I(t) = \frac{1}{2}[I_1(t) + I_2(t)] = B * e^{-\frac{t}{T_p}},$$

calculating a natural logarithm operation on both sides of the above equation, obtaining that:

$$\ln(I(t)) = \ln B - \frac{t}{T_p};$$

wherein $\ln(I(t))$ has a linear relationship with t, and a slope of the linear relationship is $$-\frac{1}{T_p};$$

calculating the slope $$-\frac{1}{T_p}$$

to obtain the primary time constant of the power grid $T_p$.

* * * * *